United States Patent [19]

Ko

[11] Patent Number: 5,767,716

[45] Date of Patent: *Jun. 16, 1998

[54] NOISE INSENSITIVE HIGH PERFORMANCE ENERGY EFFICIENT PUSH PULL ISOLATION FLIP-FLOP CIRCUITS

[75] Inventor: Uming Ko, Plano, Tex.

[73] Assignee: Texas Instruments Incorporated, Dallas, Tex.

[*] Notice: The term of this patent shall not extend beyond the expiration date of Pat. No. 5,552,738.

[21] Appl. No.: 720,165

[22] Filed: Sep. 25, 1996

Related U.S. Application Data

[60] Provisional application No. 60/004,337, Sep. 26, 1995.

[51] Int. Cl.[6] .................................. H03K 3/356
[52] U.S. Cl. ...................... 327/203; 327/208; 327/218
[58] Field of Search .................... 327/199, 200, 327/201, 202, 203, 208, 210, 211, 212, 214, 218, 219

[56] References Cited

U.S. PATENT DOCUMENTS

| | | | |
|---|---|---|---|
| 4,691,122 | 9/1987 | Schnizlein et al. | 327/203 |
| 5,463,340 | 10/1995 | Takabatake et al. | 327/203 |
| 5,497,114 | 3/1996 | Shimozono et al. | 327/203 |
| 5,552,738 | 9/1996 | Ko | 327/203 |

Primary Examiner—Timothy P. Callahan
Assistant Examiner—Eunja Shin
Attorney, Agent, or Firm—Robert D. Marshall, Jr.; James C. Kesterson; Richard L. Donaldson

[57] ABSTRACT

An energy efficient D flip-flop circuit has a master latch, a slave latch and a push-pull circuit. This push-pull circuit includes an inverter having an input connected to the output of the master latch and a transmission gate clocked in a second phase having an input connected to the output of the inverter and an output connected to the output of the slave latch. This push-pull circuit speeds the C-to-Q delay time of the circuit because there is only one gate delay to output using this circuit. The master and slave latches may employ N-type MOSFETS, CMOS transfer gates or tri-state inverters in the feedback path. The master latch may employ a double pass transistor logic input. The push-pull circuit may employ a tri-state invertor in place of the inverter and transmission gate.

30 Claims, 4 Drawing Sheets

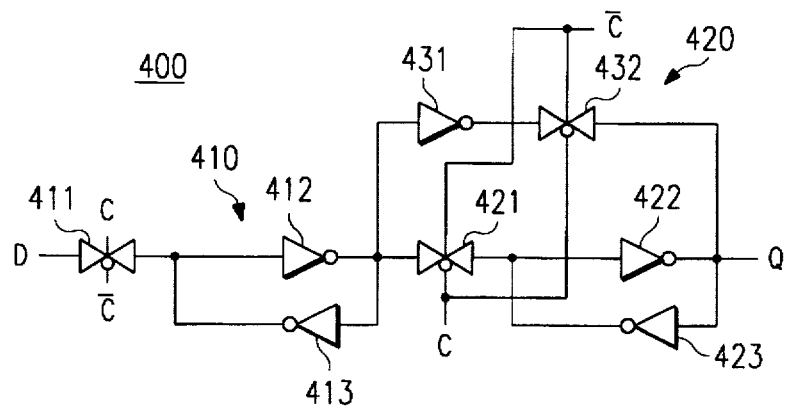
FIG. 4
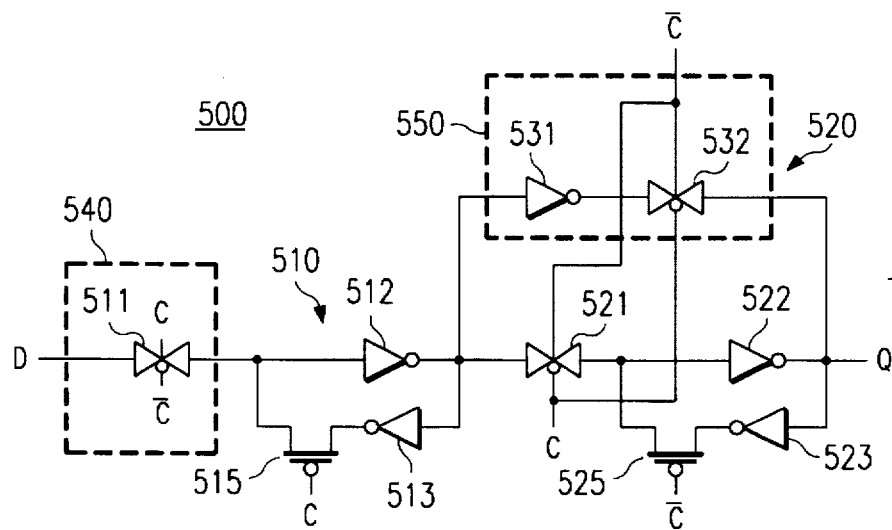
FIG. 5
FIG. 6
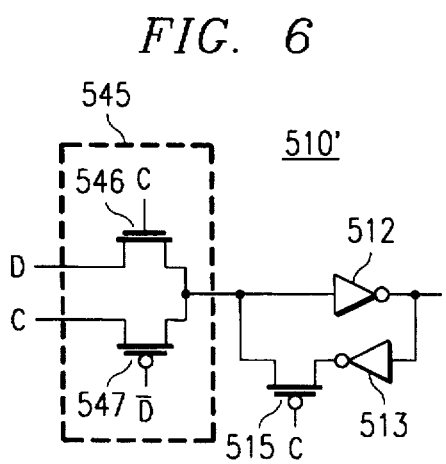
FIG. 7
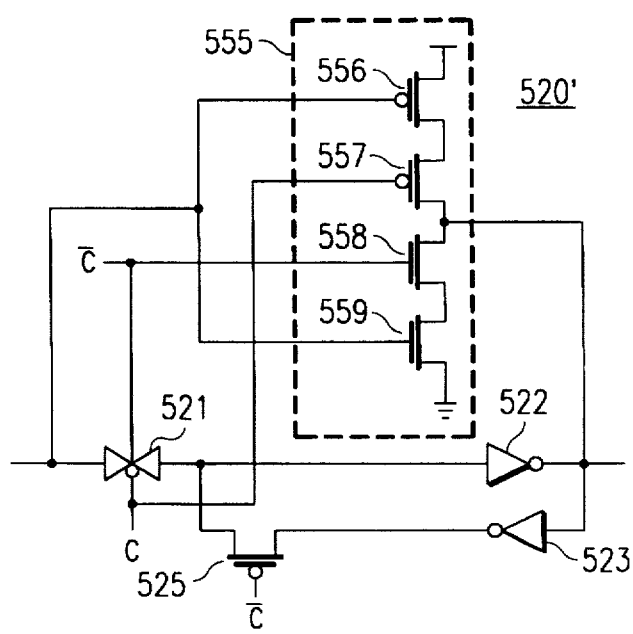

5,767,716

NOISE INSENSITIVE HIGH PERFORMANCE ENERGY EFFICIENT PUSH PULL ISOLATION FLIP-FLOP CIRCUITS

CROSS REFERENCE TO RELATED APPLICATION

Provisional application No. 60/004,337, Sep. 26, 1995.

This application is an improvement over the prior art push-pull isolation D flip-flop with P-type feedback MOSFET of U.S. patent application Ser. No. 08/426,299 filed Apr. 21, 1995, now U.S. Pat. No. 5,552,738.

TECHNICAL FIELD OF THE INVENTION

The technical field of this invention is energy efficient electronic circuits and particularly energy efficient D flip-flop circuits used in control logic in microprocessors.

BACKGROUND OF THE INVENTION

D flip-flops are one of major functions in finite state machines, which in turn is the critical part of control logic. It is known that the control logic of a microprocessor can occupy 20% of the processor's power. As more advanced architecture concepts, such as register renaming and out-of-order execution in a superscalar microprocessor, are used, the control logic will likely be more complicated and its power dissipation will likely grow beyond this current level. In addition, to boost processor clock frequency, modern processors typically adopt superpipelined execution which uses D flip-flops. Enhancing the speed of D flip-flops can either enable a higher clock rate or allow more logic depths between two pipeline registers. These two objectives of low power and high speed provide a need in the art for circuits, such as D flip-flop circuits, which are energy efficient.

SUMMARY OF THE INVENTION

This invention is an energy efficient D flip-flop circuit. This circuit has a master latch and a slave latch. The master latch has an input serving as the circuit clocked in a first phase. The slave latch has an input connected to the output of the master latch clocked in a second phase opposite to the first phase. The output of the slave latch is the output of the circuit. This circuit also has a push-pull circuit including an inverter having an input connected to the output of the master latch and a transmission gate clocked in the second phase having an input connected to the output of the inverter and an output connected to the output of the slave latch. This push-pull circuit speeds the C-to-Q delay time of the circuit because there is only one gate delay to output using this circuit.

The master and slave latches employ cross-coupled inverters. These may either be connected directly or the feedback path may be via an N-type MOSFET, a CMOS transission gate or the slave inverter may be a tri-state inverter. The feedback MOSFET of the master latch is clocked in the first phase and the feedback MOSFET of the slave latch is clocked in the second phase.

The master latch may employ a double pass transistor logic input. This double pass transistor logic input includes an N-type MOSFET having a source-drain path connected between the input of the D flip-flop circuit and a common terminal. Its base receives the clock signal in the first phase and a P-type MOSFET having a source-drain path connected between the clock signal in the first phase and the common terminal. Its base receives an inverse of the input signal.

The slave latch may employ a tri-state invertor in the push-pull circuit in place of the inverter and transmission gate.

BRIEF DESCRIPTION OF THE DRAWINGS

These and other aspects of this invention are illustrated in the drawings, in which:

FIG. 4 illustrates in schematic diagram form a push pull D flip flop circuit in accordance with this invention;

FIG. 5 illustrates in schematic diagram form a push pull isolation D flip flop circuit in accordance with this invention;

FIG. 6 illustrates an alternative circuit for the master latch of the D flip flop of FIGS. 4 or 5;

FIG. 7 illustrates an alternative circuit for the slave latch of the D flip flop of FIGS. 4 or 5.

DETAILED DESCRIPTION OF PREFERRED EMBODIMENTS

Microprocessor integrated circuit design is a compromise among a number of factors. Ideally such circuits should be high performance, use little power and require few transistors. Naturally these goals are contradictory. In the current art circuits are constructed with gates of less than one micron. In this environment the area employed by the transistors is less of a difficulty because the circuit densities are very high. However, the goals of high performance and hence high speed of operation is generally inversely related to low power of operation. A rough measure of the compromise between these conflicting goals is energy efficiency. One measure of energy efficiency for microprocessor integrated circuits is:

$$E_{IC} = \frac{F}{P}$$

where: $E_{IC}$ is the integrated circuit power efficiency measure; F is the frequency of operation in MHz; and P is the electric power consumed in watts. This measure provides a satisfactory rating for entire integrated circuits, however, it is not well suited for rating individual circuits. One measure of energy efficiency for individual circuits is:

$$E_{circuit} = \frac{1}{D \times P}$$

where: $E_{circuit}$ is the circuit power efficiency measure; D is the circuit delay time in picoseconds; and P is the electric energy consumed in femtojoules. This rating provides a manner for ranking candidate designs when selecting circuit designs for microprocessor integrated circuits.

Figure 1:
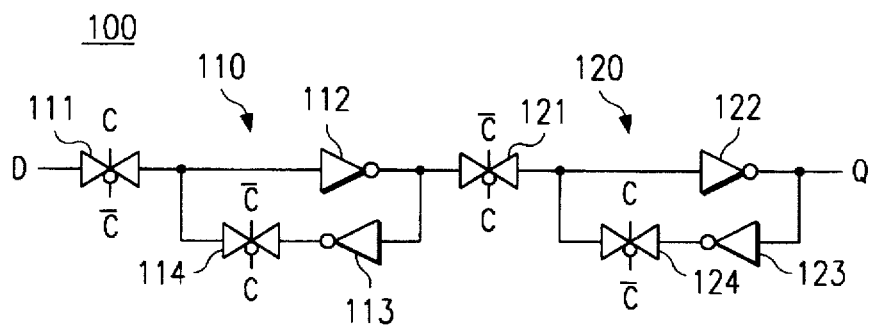
FIG. 1 illustrates in schematic diagram form a common D flip flop circuit of the prior art.

FIG. 1 illustrates a conventional negative edge-triggered D flip-flop 100 of the prior art. This circuit 100 consists of a master latch 110 and a slave latch 120. Master latch 110 includes an input transmission gate 111, a first inverter 112, a second inverter 113 and a feedback transmission gate 114. The input signal D is supplied to input transmission gate 111 of master latch 110. The output of the master latch supplies the input of the slave latch. The slave latch likewise includes an input transmission gate 121, a first inverter 122, a second inverter 123 and a feedback transmission gate 124. Note that the input transmission gate 111 of master latch 110 is clocked in the opposite phase than the input transmission gate 121 of slave latch 120. Thus these transmission gates conduct on opposite phase of the clock signal C. Inverter 122 of slave latch 120 generates the circuit output signal Q. This circuit illustrated in FIG. 1 can be constructed with 16 MOSFETs. The speed of this regular D flip-flop is limited by a two-gate delay after the clock signal C transitions from logic 1 to 0. The advantage of this D flip-flop design is that it involves minimum design risk.

Figure 2:
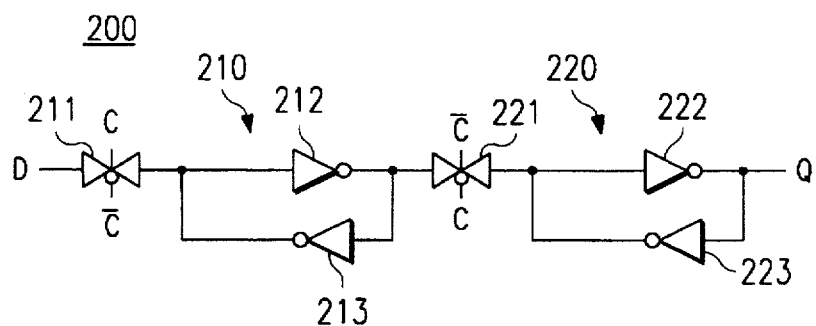
FIG. 2 illustrates in schematic diagram form a common low area D flip flop circuit of the prior art.

A common approach in the prior art to reduce area of the regular D flip-flop 100 is to remove the two feedback transmission gates 114 and 124. FIG. 2 illustrates this low-area D flip-flop circuit 200. Low-area D flip-flop circuit 200 can be constructed using 12 MOSFETS, 25% fewer transistors than the D flip-flop circuit 100. This reduces the integrated circuit area needed to construct the D flip-flop. The low-area D flip-flop circuit 200 has the disadvantage of consuming more power. The strength of feedback inverters 213 and 223 can be weakened to minimize the short-circuit power dissipation due to voltage contention. Design simulations indicate that the low-area D flip-flop circuit 200 consumes 17% more total power and is 64% slower than that of the regular D flip-flop circuit 100.

Figure 3:
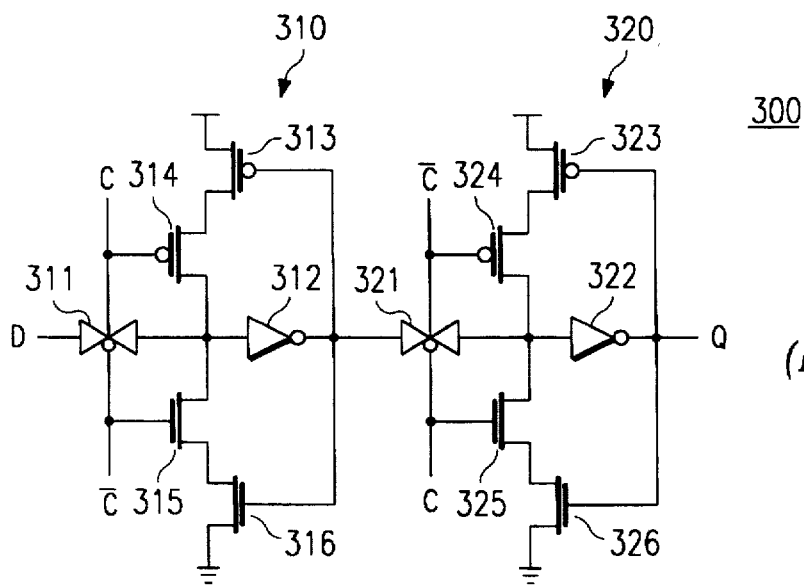
FIG. 3 illustrates in schematic diagram form a common low power D flip flop circuit of the prior art.

One approach in the prior art to optimize the D flip-flop for power dissipation is to replace the inverter 113 and transmission gate 114 in the feedback path of the master latch 110 with a tri-state inverter. Another tri-state invertor replaces the inverter 123 and the transmission gate 124 in the feedback path of the slave latch. FIG. 3 illustrates this low-power D flip-flop circuit 300. The tri-state inverter in the master latch 310 includes P-type MOSFETs 313 and 314, and N-type MOSFETs 315 and 316. The tri-state inverter in the slave latch 320 includes P-type MOSFETs 323 and 324, and N-type MOSFETs 325 and 326. Low-power D flip-flop circuit 300 can be constructed with 16 MOSFETs, the same number as the regular D flip-flop circuit 100. Only one of MOSFETs 314 or 315 is conductive at one time depending upon the polarity of the clock signal C. Similarly, only one of MOSFETs 324 or 325 is conductive at one time. This avoids short-circuit power dissipation in the feedback path. Design simulations indicate that this yields only 3% reduction in total power and 1% slower speed when compared to the regular D flip-flop circuit 100. Circuit simulations indicate that low-power D flip-flop circuit 300 is comparable to the regular D flip-flop circuit 100 in area and energy efficiency.

FIG. 4 illustrates a circuit according to a first embodiment of the invention. To optimize for speed, an inverter 431 and a transmission gate 432 are added between outputs of master latch 410 and slave latch 420. This accomplishes a push-pull effect at slave latch 420. This adds four MOSFETs, but reduces the clock-to-output (C-to-Q) delay from two gates in the regular D flip-flop circuit 100 to one gate. To offset the four added MOSFETs in the push-pull circuit, the two transmission gates 114 and 124 in feedback paths of the regular D flip-flop circuit 100 are eliminated in a manner similar to the low-area D flip-flop circuit 200. This yields a circuit employing 16 MOSFETs, the same as the regular D flip-flop circuit 100. Compared to the regular D flip-flop circuit 100, circuit simulations indicate that this push-pull D flip-flop circuit 400 is 38% faster but employs 19% more power. This increase in speed more than offsets the increase in power, yielding a circuit having a higher energy efficiency than the regular D flip-flop circuit 100.

FIG. 5 illustrates an alternative and preferred embodiment of this invention which uses less power. To optimize for energy usage in the push-pull D flip-flop, two P-type MOSFETs 515 and 525 are added to isolate the feedback path. The source-drain path of MOSFET 515 connects the output of inverter 513 to the input of inverter 512. The base of MOSFET 515 receives the clock signal. The source-drain path of MOSFET 525 connects the output of inverter 523 to the input of inverter 522. The base of MOSFET 525 receives the inverse of the clock signal. This push-pull isolation D flip-flop circuit 500 has an increased transistor count of 18, but circuit simulations indicate that it achieves a 20% reduction in total power and an increase in speed of 26% relative to the push-pull D flip-flop circuit 400. Compared to the regular D flip-flop circuit 100, the push-pull isolation D flip-flop circuit 500 is 64% faster and consumes 1% less power. Due to the greater increase in speed than increase in power, push-pull isolation D flip-flop 500 has a higher energy efficiency than regular D flip-flop circuit 100.

FIG. 6 illustrates a variation of the circuits of FIGS. 4 and 5. A technique known in the art as double pass transistor logic is used at the input to the D flip-flop circuit. This technique is generally believed in the art to result in faster circuit operation. The input section 540 illustrated in FIG. 5, consisting of a transmission gate, is replaced by input section 545, consisting of N-type MOSFET 546 and P-type MOSFET 547. N-type MOSFET 546 has its source-drain path connected between the input signal D and the input to inverter 512. Its base receives the clock signal. P-type MOSFET has its source-drain path connected between the clock signal and the input to inverter 512. Its base receives the inverse of the input signal $\overline{D}$. Note FIG. 6 illustrates only master latch 510', the slave latch of this D flip-flop could be as illustrated at 420 in FIG. 4 or 520 in FIG. 5. A push-pull isolation double pass transistor logic input D flip-flop has a 20% reduction in the setup time as compared to push-pull isolation D flip-flop 500. However, when D is logic 1 and C switches from logic 1 to 0, a DC-path exists from invertor 513, P-type isolation MOSFET 515, P-type input MOSFET 547 and the clock input. This causes a circuit employing this double pass transistor logic input 545 to consume 60% more power relative to the push-pull isolation D flip-flop circuit 500. Since this additional power consumption is greater than the addition speed, this results in a lower power efficiency.

FIG. 7 illustrates another variation of the circuits of FIGS. 4 and 5. The push-pull section 550 of push-pull isolation D flip-flop circuit 500, consisting of inverter 531 and transmission gate 532, is replaced by a tri-state inverter. Note FIG. 7 illustrates only slave latch 520', the master latch of this D flip-flop could be as illustrated at 410 in FIG. 4 or 120 in FIG. 5. The tri-state inverter includes P-type MOSFETs 551 and 552, and N-type MOSFETs 315 and 316. Though this variation reduces the short-circuit power consumption of the push-pull driver, circuit simulations indicate that it weakens the drive strength due to stacked MOSFETs. This circuit is thus 10% less efficient in energy compared to the push-pull isolation D flip-flop circuit 500.

Table 1 lists the essential parameters of D flip-flop circuits shown in FIGS. 1 to 5. The conventional column refers to circuit 100 illustrated in FIG. 1, the low-area column refers to circuit 200 illustrated in FIG. 2, the low-power column refers to circuit 300 illustrated in FIG. 3, the push-pull column refers to circuit 400 illustrated in FIG. 4 and the push-pull isolation column refers to circuit 500 illustrated in FIG. 5. Table 1 does not cover the variations illustrated in FIGS. 6 and 7. Note that the percentage figures for average power, delay time and energy are relative to push-pull isolation D flip-flop circuit 500 as 100%.

TABLE 1

| Parameters: 0.6 μm nominal, 3.3 V, 10 MHz | Regular FIG. 1 | Low-area FIG. 2 | Low-power FIG. 3 | Push-pull FIG. 4 | Push-pull isolation FIG. 5 | unit |
| --- | --- | --- | --- | --- | --- | --- |
| transistors | 16 | 12 | 16 | 16 | 18 | transistors |
| total transistor width | 50.6 | 45.0 | 50.6 | 47.4 | 50.0 | μm |
| Power average | 131.7 | 154.6 | 127.5 | 156.2 | 130.5 | μW |
| percentage | 101 | 118 | 98 | 120 | 100 | % |
| Delay, C-to-Q | 218.2 | 304.0 | 219.8 | 168.0 | 133.1 | ps |
| percentage | 164 | 228 | 165 | 126 | 100 | % |
| Energy | 28.7 | 47.0 | 28.0 | 26.2 | 17.4 | fJ |
| percentage | 165 | 270 | 161 | 151 | 100 | % |

Table 1 shows the low-area D flip-flop circuit 200, which uses fewer transistors, consumes more energy than the rest of D flip-flops circuits. Compared to a regular D flip-flop circuit 100, a low-power D flip-flop circuit 200 decreases power dissipation by 3% and a push-pull D flip-flop circuit 300 reduces delay by 38%. These two circuits end up with a comparable energy efficiency. The proposed push-pull isolation D flip-flop circuit 500 with a P-type feedback MOSFET improves the speed clock-to-output (C-to-Q delay) by 61% to 170%, compared to the three known solutions (conventional, low-area, and low-power D flip flops). This performance enhancement from a P-type MOSFET is accomplished with about the same power dissipation as the conventional and low-power D flip flop or at 18% less power than the low-area D flip flop).

The power dissipation comparisons shown in Table 1 were measured under conditions closer to an ideal case where no noises were injected. However, when a D flip flop is embedded in a VLSI (Very Large Scale Integration) device, it is typically optimistic to assume that no noise is coupled from adjacent circuit nodes or metal routing above the physical layout of a D flip flop. To emulate a more realistic VLSI device, a noise is injected to the master latch of the P-type feedback MOSFET D flip flop through a coupling capacitor $C_{ap}$ as shown in the FIG. 8. This allows observation of the potential power dissipation variation. The value of the coupling capacitor is used to indicate the magnitude of noise injected. As shown in Table 2, when the capacitance value is varied from 0 fF to 10 fF, the power dissipation of a push-pull isolation D flip-flop with P-type feedback MOSFET increases by 18% from 130.5 mW to 154.5 mW.

When the noise is injected in the sampling phase while the input transmission gate of the master latch is conducting, the driving gate to the D flip flop is able to maintain either voltage rail at the node injected. However, if the noise is injected during the pass-through phase while the input transmission gate of the slave latch is conducting, the only driver available in the master latch is the feedback inverter. If the injected node has a logic value of "0" and is injected with a voltage value above the threshold voltage $V_{th}$ of MOSFETs, the feedback inverter along with the P-type MOSFET 515 won't be able to pull it down to ground rail again. This is due to the $V_{th}$ drop across the P-type MOSFET. The non-ground-rail node causes both the P-type MOSFET and the N-type MOSFET of the driver inverter 512 of the master latch to conduct. This dissipates static power. The degree of power increase is based upon at least four factors:

1) the value of coupling capacitor or the magnitude of the noise;

2) when the noise happens, because noise early in the pass-through phase results in a longer time dissipating static power;

3) the polarity of the noise, because high-going noise injected into the input causes dissipation of static power, but a low-going noise does not; and 4) process variation factors in gate capacitance, junction capacitance and the like.

TABLE 2

| Power at Capacitance/ Delay | Push-Pull Isolation PMOS | Push-Pull Isolation NMOS | Push-Pull Isolation CMOS | Push-Pull Isolation Tri-state | Units |
| --- | --- | --- | --- | --- | --- |
| Power at 0 fF | 130.5 | 131.5 | 140.3 | 134.8 | mW |
| Power at 4 fF | 133.5 | 135.4 | 143.7 | 138.0 | mW |
| Power at 10 fF | 154.5 | 147.5 | 149.0 | 143.3 | mW |
| ΔPower from 0 to 10 fF | +18 | +12 | +6 | +6 | % |
| Delay | 100 | 101 | 111 | 106 | % |

Figure 8:
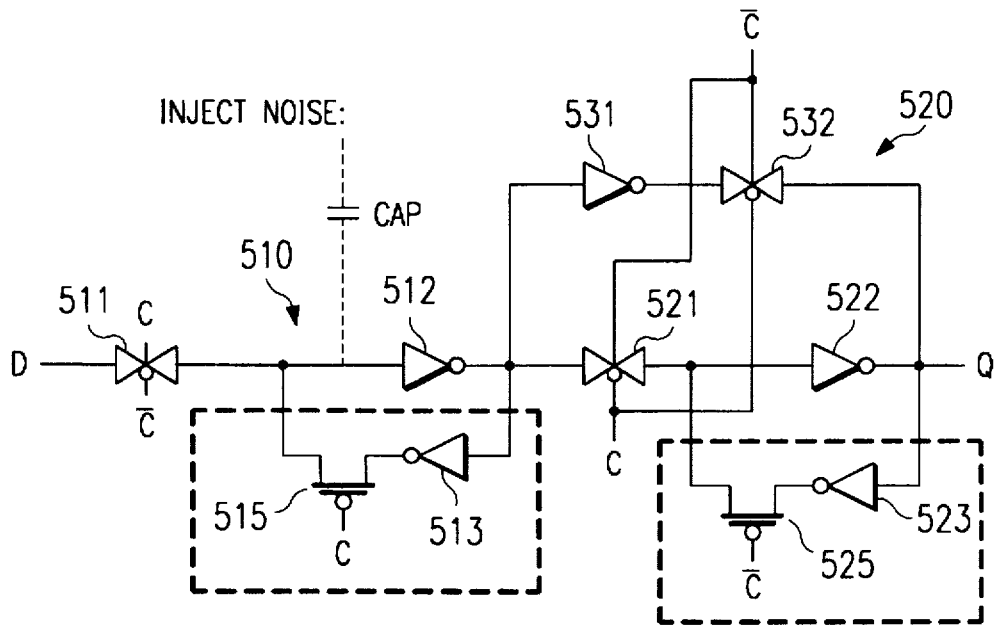
FIG. 8 illustrates a second view of the push pull isolation D flip flop circuit illustrated in FIG. 5 showing injected noise.
Figure 9:
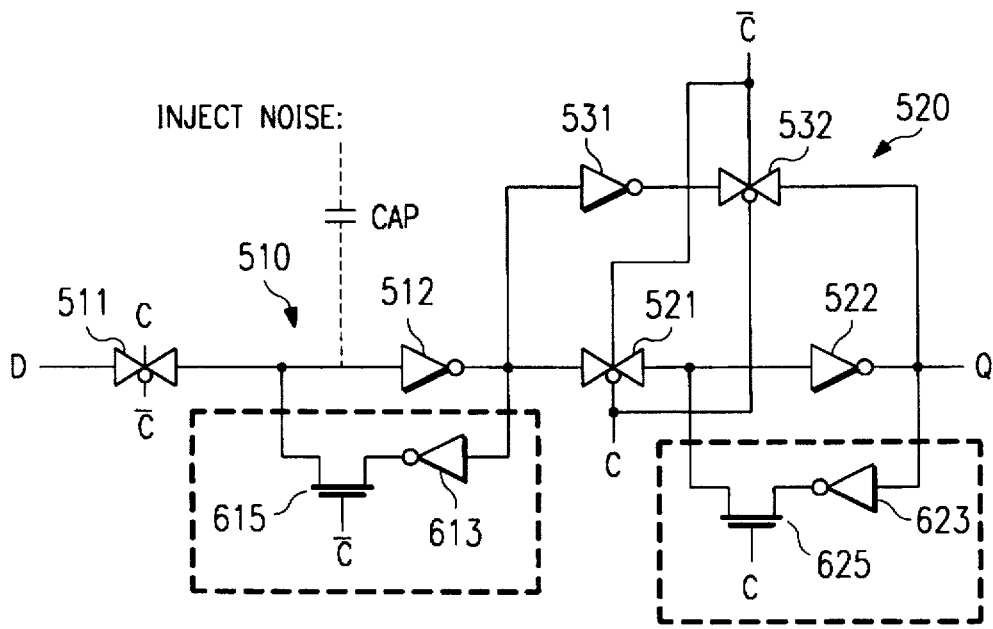
FIG. 9 illustrates an alternative of the push pull isolation D flip flop circuit illustrated in FIG. 8 employing N-type MOSFET feedback.

A first proposed approach to reduce the 18% power increase in P-type MOSFET D flip-flop circuits due to noise is illustrated in FIG. 9. This first embodiment replaces the feedback P-type MOSFETs 515 and 525 with similar N-type MOSFETs 615 and 625. Both P-type MOSFETs 515 and 525 illustrated in FIG. 8 and N-type MOSFETs 615 and 625 illustrated in FIG. 9 have the same drawn transistor width and length. Several process-related factors may cause different gate capacitance, and therefore different capacitive power dissipation. For a 0.6 Mm CMOS process employed by Texas Instruments, the assignee of this application, the width reduction of a P-type MOSFET is about 0.25 μm more than that of a N-type MOSFET. This difference in process causes slightly more power dissipation for N-type MOSFET for the case of either no noise or the little noise. This is shown in Table 2. However, if the noise-injected node is at a logic "1" when a low-going noise is introduced, the feedback N-type MOSFET can't pull the node back to the VCC supply. This causes the similar static power dissipation. An increase of 12% power is measured when the $C_{ap}$ value is increased from 0 fF to 10 fF. This lower percentage of increase is likely due to the $V_{th}$ of an N-type MOSFET being slightly lower than the $V_{th}$ of a P-type MOSFET. If the transistor budget is limited, as for example in the above named 0.6 µm CMOS process, the N-type MOSFET improves the noise sensitivity by 50% relative to that of the P-type MOSFET D flip flop.

Figure 10:
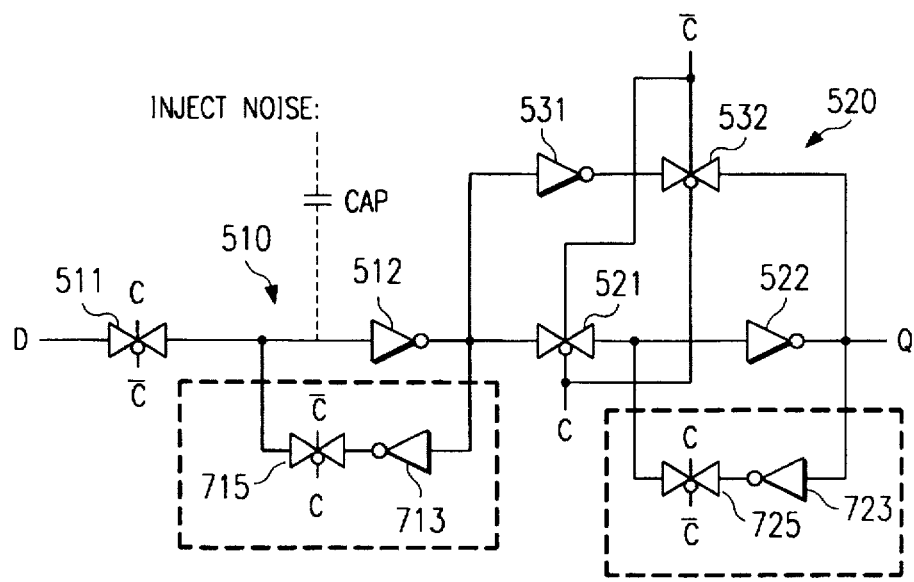
FIG. 10 illustrates an alternative of the push pull isolation D flip flop circuit illustrated in FIG. 8 employing complementary MOSFET feedback.

A second proposed approach to further reduce the 12% power increase in N-type MOSFET is to replace the feedback N-type MOSFETs 515 and 525 with a CMOS transmission gates 715 and 725, respectively. This is illustrated in FIG. 10. This approach allows the feedback inverter to drive the noise-injected node to either supply voltage. This minimizes the static power dissipation due to either high-going or low-going noise. The power dissipation is increased by only 6% when the $C_{ap}$ value is increased from 0 fF to 10 fF. However, this low percentage of power increase is at the expense of two more MOSFETs, compared to either P-type MOSFET and N-type MOSFET D flip flops. The increased transistor count adds to the capacitive power dissipation because of additional gate capacitance. Thus complementary MOSFET dissipates more power than both P-type MOSFET or N-type MOSFET under no noise or little noise (Cap=4 fF) conditions. On the other hand, when the noise coupling capacitance is increased to 10 fF, the complementary MOSFET dissipates less power than the P-type MOSFET. Relative to P-type MOSFET, the noise sensitivity of complementary MOSFET has been reduced from 18% down to 6%.

Figure 11:
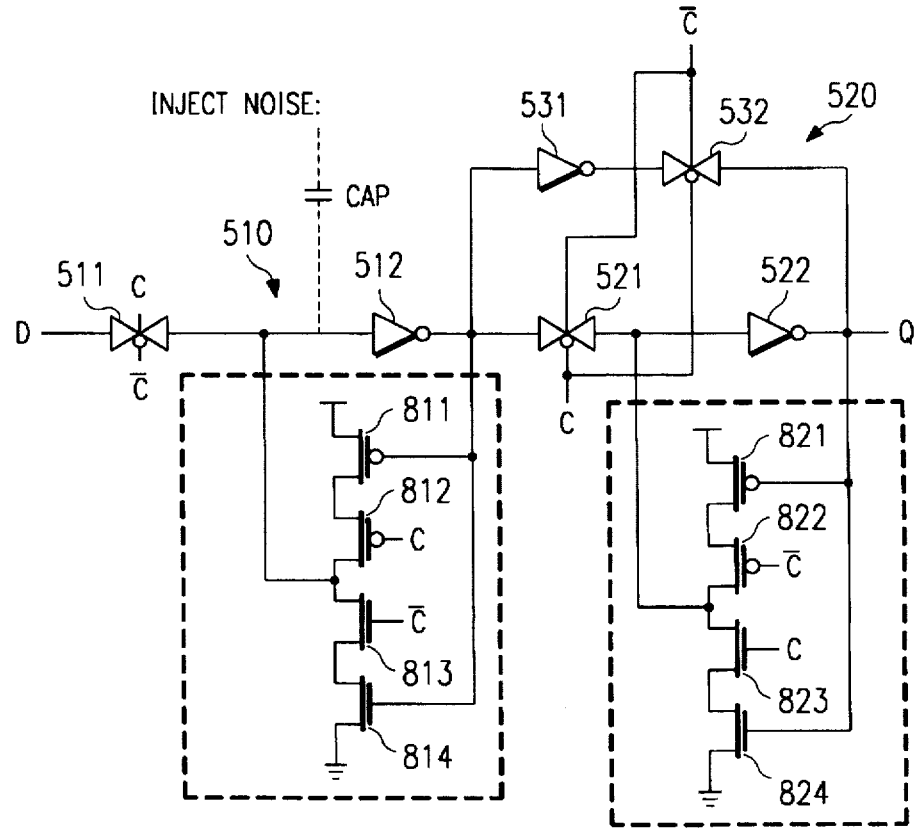
FIG. 11 illustrates an alternative of the push pull isolation D flip flop circuit illustrated in FIG. 8 employing tri-state feedback.

A third proposed approach substitutes a tri-state gate for the P-type MOSFET and inverter of the circuit of FIG. 8 in both the master and slave latches. A first tri-state gate consisting of P-type MOSFETs 811 and 812 and N-type MOSFETs 813 and 814 replaces the feedback path of inverter 513 and P-type MOSFET 515. A second tri-state gate consisting of P-type MOSFETs 821 and 822 and N-type MOSFETs 823 and 824 replaces the feedback path of inverter 523 and P-type MOSFET 525. This maintains the noise insensitivity of complementary MOSFET D flip flop which further reduces overall power dissipation. This approach, called push-pull isolation tri-state D flip-flop, is shown in FIG. 11. The transistor sizes of the complementary MOSFET circuit of FIG. 10 are maintained the same in the tri-state D flip flop. The tri-state D flip flop minimizes the short-circuit power dissipation in the feedback path, and that is the major reason why it's power dissipation is consistently lower than that of the complementary MOSFET under all noise conditions summarized in Table 2. Compared to the P-type MOSFET and N-type MOSFET D flip flops, the tri-state D flip flop minimizes static power dissipation by pulling noise-injected node to either voltage supply. Compared to the P-type MOSFET, the N-type MOSFET, and the complementary MOSFET, the tri-state D flip-flop further minimizes the short-circuit power dissipation in the feedback path. The speed degradation of tri-state circuit is a relatively small 6% compared to the complementary MOSFET of 11%.

The three feedback techniques illustrated in FIGS. 9, 10 and 11 could be used with the double pass transistor logic at the input to the D flip-flop circuit as illustrated in FIG. 6. Likewise, the three feedback techniques illustrated in FIGS. 9, 10 and 11 could be used with the tri-state push-pull inverter illustrated in FIG. 7.

The proposed solutions improve noise sensitivity considering the 18% power increase of P-type MOSFET being reduced down to 6% increase in either the complementary MOSFET or tri-state D flip flop. For a highly noisy VLSI environment, the proposed solutions present more energy-efficient alternatives to the prior art. The proposed solutions combined the high-performance, energy-efficient feature of push-pull isolation D flip-flop with P-type feedback MOSFET with the noise insensitivity and presents more robust design options for VLSI designs with D flip flops.

What is claimed is:

1. A D flip-flop circuit having and input and an output comprising:
   a master latch having an input receiving an input signal of said D flip-flop circuit clocked in a first phase and an output, said master latch including
      a first master latch inverter having an input connected to said input of said master latch and an output serving as output of said master latch,
      a second master latch inverter having an input connected to said output of said first master latch inverter and an output, and
      an N-type MOSFET having a source-drain path connected between said output of said second master latch inverter and said input of said first master latch inverter and a base receiving a clock signal in a second phase opposite to said first phase;
   a slave latch having an input connected to said output of said master latch clocked in said second phase opposite to said first phase and an output serving as output of said D flip-flop circuit, said slave latch including
      a first slave latch inverter having an input connected to said input of said slave latch and an output serving as output of said slave latch,
      a second slave latch inverter having an input connected to said output of said first slave latch inverter and an output, and
      an N-type MOSFET having a source-drain path connected between said output of said second slave latch inverter and said input of said first slave latch inverter and a base receiving said clock signal in said first phase; and
   a push-pull circuit including
      an inverter having an input connected to said output of said master latch and an output, and
      a transmission gate clocked in said second phase having an input connected to said output of said inverter and an output connected to said output of said slave latch.

2. The D flip-flop circuit of claim 1, wherein:
   said master latch includes
      a transmission gate clocked in said first phase having an input serving as input to said master latch and an output.

3. The D flip-flop circuit of claim 1, wherein:
   said master latch includes a double pass transistor logic input serving as input of said D flip-flop circuit clocked in said first phase and an output, said double pass transistor logic input including
      an N-type MOSFET having a source-drain path connected between said input of said D flip-flop circuit and a common terminal and a base receiving said clock signal in said first phase, and
      a P-type MOSFET having a source-drain path connected between said clock signal in said first phase and said common terminal and a base receiving an inverse of said input signal at said input of said D flip-flop circuit.

4. The D flip-flop circuit of claim 1, wherein:
   said slave latch including
      a transmission gate clocked in said second phase having an input serving as input to said slave latch and an output.

5. A D flip-flop circuit having and input and an output comprising:
  a master latch having an input receiving an input signal of said D flip-flop circuit clocked in a first phase and an output, said master latch including
    a first master latch inverter having an input connected to said input of said master latch and an output serving as output of said master latch,
    a second master latch inverter having an input connected to said output of said first master latch inverter and an output, and
    an N-type MOSFET having a source-drain path connected between said output of said second master latch inverter and said input of said first master latch inverter and a base receiving a clock signal in a second phase opposite to said first phase;
  a slave latch having an input connected to said output of said master latch clocked in said second phase opposite to said first phase and an output serving as output of said D flip-flop circuit, said slave latch including
    a first slave latch inverter having an input connected to said input of said slave latch and an output serving as output of said slave latch,
    a second slave latch inverter having an input connected to said output of said first slave latch inverter and an output, and
    an N-type MOSFET having a source-drain path connected between said output of said second slave latch inverter and said input of said first slave latch inverter and a base receiving said clock signal in said first phase; and
  a tri-state inverter having an input connected said output of said master latch and an output connected to said output of said slave latch.

6. The D flip-flop circuit of claim 5, wherein:
  said tri-state inverter includes
    a first P-type MOSFET having a source-drain path connected between a supply voltage and a first common terminal and a base connected to said output of said master latch,
    a second P-type MOSFET having a source-drain path connected between said first common terminal and said output of said slave latch and a base receiving said clock signal in said first phase,
    a first N-type MOSFET having a source-drain path connected between said output of said slave latch and a second common terminal and a base receiving said clock signal in said second phase inverse to said first phase, and
    a second N-type MOSFET having a source-drain path connected between said second common terminal and ground and a base connected to said output of said master latch.

7. The D flip-flop circuit of claim 5, wherein:
  said master latch includes
    a transmission gate clocked in said first phase having an input serving as input to said master latch and an output.

8. The D flip-flop circuit of claim 5, wherein:
  said master latch includes a double pass transistor logic input serving as input of said D flip-flop circuit clocked in said first phase and an output, said double pass transistor logic input including
    an N-type MOSFET having a source-drain path connected between said input of said D flip-flop circuit and a common terminal and a base receiving said clock signal in said first phase, and
    a P-type MOSFET having a source-drain path connected between said clock signal in said first phase and said common terminal and a base receiving an inverse of said input signal at said input of said D flip-flop circuit.

9. The D flip-flop circuit of claim 5, wherein:
  said slave latch includes
    a transmission gate clocked in said second phase having an input serving as input to said slave latch and an output.

10. A D flip-flop circuit having and input and an output comprising:
  a master latch having an input receiving an input signal of said D flip-flop circuit clocked in a first phase and an output, said master latch including
    a first master latch inverter having an input connected to said input of said master latch and an output serving as output of said master latch,
    a second master latch inverter having an input connected to said output of said first master latch inverter and an output, and
    a transmission gate clocked in a second phase opposite to said first phase having an input connected to said output of said second master latch inverter and an output connected to said input of said first master latch inverter;
  a slave latch having an input connected to said output of said master latch clocked in said second phase opposite to said first phase and an output serving as output of said D flip-flop circuit, said slave latch including
    a first slave latch inverter having an input connected to said input of said slave latch and an output serving as output of said slave latch,
    a second slave latch inverter having an input connected to said output of said first slave latch inverter and an output, and
    a transmission gate clocked in said first phase having an input connected to said output of said second slave latch inverter and an output connected to said input of said first slave latch inverter; and
  a push-pull circuit including
    an inverter having an input connected to said output of said master latch and an output, and
    a transmission gate clocked in said second phase having an input connected to said output of said inverter and an output connected to said output of said slave latch.

11. The D flip-flop circuit of claim 10, wherein:
  said master latch includes
    a transmission gate clocked in said first phase having an input serving as input to said master latch and an output.

12. The D flip-flop circuit of claim 10, wherein:
  said master latch includes a double pass transistor logic input serving as input of said D flip-flop circuit clocked in said first phase and an output, said double pass transistor logic input including
    an N-type MOSFET having a source-drain path connected between said input of said D flip-flop circuit and a common terminal and a base receiving said clock signal in said first phase, and
    a P-type MOSFET having a source-drain path connected between said clock signal in said first phase and said common terminal and a base receiving an inverse of said input signal at said input of said D flip-flop circuit.

13. The D flip-flop circuit of claim 10, wherein:
said slave latch including
a transmission gate clocked in said second phase having an input serving as input to said slave latch and an output.

14. A D flip-flop circuit having and input and an output comprising:
a master latch having an input receiving an input signal of said D flip-flop circuit clocked in a first phase and an output, said master latch including
a first master latch inverter having an input connected to said input of said master latch and an output serving as output of said master latch,
a second master latch inverter having an input connected to said output of said first master latch inverter and an output, and
a master transmission gate clocked in a second phase opposite to said first phase having an input connected to said output of said second master latch inverter and an output connected to said input of said first master latch inverter;
a slave latch having an input connected to said output of said master latch clocked in said second phase opposite to said first phase and an output serving as output of said D flip-flop circuit, said slave latch including
a first slave transmission gate clocked in said second phase having an input serving as input to said slave latch and an output,
a first slave latch inverter having an input connected to said output of said transmission gate and an output serving as output of said slave latch,
a second slave latch inverter having an input connected to said output of said first slave latch inverter and an output, and
a second slave transmission gate clocked in said first phase having an input connected to said output of said second slave latch inverter and an output connected to said input of said first slave latch inverter; and
a tri-state inverter having an input connected said output of said master latch and an output connected to said output of said slave latch.

15. The D flip-flop circuit of claim 14, wherein:
said tri-state inverter includes
a first P-type MOSFET having a source-drain path connected between a supply voltage and a first common terminal and a base connected to said output of said master latch,
a second P-type MOSFET having a source-drain path connected between said first common terminal and said output of said slave latch and a base receiving a clock signal in said first phase,
a first N-type MOSFET having a source-drain path connected between said output of said slave latch and a second common terminal and a base receiving said clock signal in said second phase inverse to said first phase, and
a second N-type MOSFET having a source-drain path connected between said second common terminal and ground and a base connected to said output of said master latch.

16. The D flip-flop circuit of claim 14, wherein:
said master latch includes
a transmission gate clocked in said first phase having an input serving as input to said master latch and an output.

17. The D flip-flop circuit of claim 14, wherein:
said master latch includes a double pass transistor logic input serving as input of said D flip-flop circuit clocked in said first phase and an output, said double pass transistor logic input including
an N-type MOSFET having a source-drain path connected between said input of said D flip-flop circuit and a common terminal and a base receiving a clock signal in said first phase, and
a P-type MOSFET having a source-drain path connected between said clock signal in said first phase and said common terminal and a base receiving an inverse of said input signal at said input of said D flip-flop circuit.

18. A D flip-flop circuit having and input and an output comprising:
a master latch having an input receiving an input signal of said D flip-flop circuit clocked in a first phase and an output, said master latch including
a first master latch inverter having an input connected to said input of said master latch and an output serving as output of said master latch,
a master tri-state inverter having an input connected said output of said first master latch inverter and an output connected to said input of said first master latch inverter;
a slave latch having an input connected to said output of said master latch clocked in said second phase opposite to said first phase and an output serving as output of said D flip-flop circuit, said slave latch including
a first slave latch inverter having an input connected to said input of said slave latch and an output serving as output of said slave latch,
a slave tri-state inverter having an input connected said output of said first slave latch inverter and an output connected to said input of said first slave latch inverter; and
a push-pull circuit including
an inverter having an input connected to said output of said master latch and an output, and
a transmission gate clocked in said second phase having an input connected to said output of said inverter and an output connected to said output of said slave latch.

19. The D flip-flop circuit of claim 18, wherein:
said master tri-state inverter includes
a first P-type MOSFET having a source-drain path connected between a supply voltage and a first common terminal and a base connected to said output of said master latch,
a second P-type MOSFET having a source-drain path connected between said first common terminal and said input of said master latch and a base receiving a clock signal in said first phase,
a first N-type MOSFET having a source-drain path connected between said input of said master latch and a second common terminal and a base receiving said clock signal in said second phase inverse to said first phase, and
a second N-type MOSFET having a source-drain path connected between said second common terminal and ground and a base connected to said output of said master latch.

20. The D flip-flop circuit of claim 18, wherein:
said slave tri-state inverter includes
a first P-type MOSFET having a source-drain path connected between a supply voltage and a first common terminal and a base connected to said output of said slave latch, a second P-type MOSFET having a source-drain path connected between said first common terminal and said input of said slave latch and a base receiving a clock signal in said first phase, a first N-type MOSFET having a source-drain path connected between said input of said slave latch and a second common terminal and a base receiving said clock signal in said second phase inverse to said first phase, and a second N-type MOSFET having a source-drain path connected between said second common terminal and ground and a base connected to said output of said slave latch.

21. The D flip-flop circuit of claim 18, wherein:

said master latch includes a transmission gate clocked in said first phase having an input serving as input to said master latch and an output.

22. The D flip-flop circuit of claim 18, wherein:

said master latch includes a double pass transistor logic input serving as input of said D flip-flop circuit clocked in said first phase and an output, said double pass transistor logic input including an N-type MOSFET having a source-drain path connected between said input of said D flip-flop circuit and a common terminal and a base receiving a clock signal in said first phase, and a P-type MOSFET having a source-drain path connected between said clock signal in said first phase and said common terminal and a base receiving an inverse of said input signal at said input of said D flip-flop circuit.

23. The D flip-flop circuit of claim 18, wherein:

said slave latch including a transmission gate clocked in said second phase having an input serving as input to said slave latch and an output.

24. A D flip-flop circuit having and input and an output comprising:

a master latch having an input receiving an input signal of said D flip-flop circuit clocked in a first phase and an output, said master latch including a first master latch inverter having an input connected to said input of said master latch and an output serving as output of said master latch, a master tri-state inverter having an input connected said output of said first master latch inverter and an output connected to said input of said first master latch inverter;

a slave latch having an input connected to said output of said master latch clocked in said second phase opposite to said first phase and an output serving as output of said D flip-flop circuit, said slave latch including a first slave latch inverter having an input connected to said input of said slave latch and an output serving as output of said slave latch, a slave tri-state inverter having an input connected said output of said first slave latch inverter and an output connected to said input of said first slave latch inverter; and a push-pull tri-state inverter having an input connected said output of said master latch and an output connected to said output of said slave latch.

25. The D flip-flop circuit of claim 24, wherein:

said push-pull tri-state inverter includes a first P-type MOSFET having a source-drain path connected between a supply voltage and a first common terminal and a base connected to said output of said master latch, a second P-type MOSFET having a source-drain path connected between said first common terminal and said output of said slave latch and a base receiving a clock signal in said first phase, a first N-type MOSFET having a source-drain path connected between said output of said slave latch and a second common terminal and a base receiving said clock signal in said second phase inverse to said first phase, and a second N-type MOSFET having a source-drain path connected between said second common terminal and ground and a base connected to said output of said master latch.

26. The D flip-flop circuit of claim 24, wherein:

said master tri-state inverter includes a first P-type MOSFET having a source-drain path connected between a supply voltage and a first common terminal and a base connected to said output of said master latch, a second P-type MOSFET having a source-drain path connected between said first common terminal and said input of said master latch and a base receiving a clock signal in said first phase, a first N-type MOSFET having a source-drain path connected between said input of said master latch and a second common terminal and a base receiving said clock signal in said second phase inverse to said first phase, and a second N-type MOSFET having a source-drain path connected between said second common terminal and ground and a base connected to said output of said master latch.

27. The D flip-flop circuit of claim 24, wherein:

said slave tri-state inverter includes a first P-type MOSFET having a source-drain path connected between a supply voltage and a first common terminal and a base connected to said output of said slave latch, a second P-type MOSFET having a source-drain path connected between said first common terminal and said input of said slave latch and a base receiving a clock signal in said first phase, a first N-type MOSFET having a source-drain path connected between said input of said slave latch and a second common terminal and a base receiving said clock signal in said second phase inverse to said first phase, and a second N-type MOSFET having a source-drain path connected between said second common terminal and ground and a base connected to said output of said slave latch.

28. The D flip-flop circuit of claim 24, wherein:

said master latch includes a transmission gate clocked in said first phase having an input serving as input to said master latch and an output.

29. The D flip-flop circuit of claim 24, wherein:

said master latch includes a double pass transistor logic input serving as input of said D flip-flop circuit clocked in said first phase and an output, said double pass transistor logic input including an N-type MOSFET having a source-drain path connected between said input of said D flip-flop circuit and a common terminal and a base receiving a clock signal in said first phase, and a P-type MOSFET having a source-drain path connected between said clock signal in said first phase and said common terminal and a base receiving an inverse of said input signal at said input of said D flip-flop circuit.

30. The D flip-flop circuit of claim 24, wherein:
said slave latch includes
a transmission gate clocked in said second phase having an input serving as input to said slave latch and an output.

* * * * *